Sept. 21, 1965 J. R. MACDONALD 3,208,002

SEMICONDUCTOR INTEGRATED CIRCUIT DEVICE USING FIELD-EFFECT TRANSISTORS

Original Filed Sept. 18, 1959 2 Sheets-Sheet 1

INVENTOR.

JAMES ROSS MACDONALD

BY

Stevens, Davis, Miller and Mosher

ATTORNEYS

INVENTOR.
JAMES ROSS MACDONALD
BY
Stevens, Davis, Miller & Mosher
ATTORNEYS

United States Patent Office
3,208,002
Patented Sept. 21, 1965

3,208,002

SEMICONDUCTOR INTEGRATED CIRCUIT DEVICE USING FIELD-EFFECT TRANSISTORS

James Ross Macdonald, Dallas, Tex., assignor to Texas Instruments Incorporated, Dallas, Tex., a corporation of Delaware Continuation of application Ser. No. 841,434, Sept. 18, 1959. This application Jan. 16, 1963, Ser. No. 252,546
4 Claims. (Cl. 330—38)

This invention relates to semiconductor integrated circuits employing field-effect transistors, and more particularly to integrated circuitry using field-effect devices connected together in a single monocrystalline body of semiconductor material wherein one of the field-effect transistors is connected to operate as a constant-current device.

This application is a continuation of my co-pending application Serial No. 841,434, filed September 18, 1959, now abandoned, which was a continuation in part of my abandoned application Serial No. 429,447, filed May 13, 1954.

Transistors of the field-effect type were first proposed by Shockley in the "Proceedings of the IRE," November 1952, in which a detailed explanation of the theory was presented. An experimental verification of the theory has also been presented by Dacey and Ross in the "Proceedings of the IRE," August 1953. In essence, a field-effect transistor can be regarded as a structure containing a semiconductor current path, the conductivity of which is modulated by the application of a transverse electric field. This action in the field-effect transistor is analogous to applying a voltage to the grid of a vacuum tube to control the flow of electrons from the cathode to the plate and, for this reason, the field-effect transistor is often called an analog transistor.

The current conducting path of a field-effect transistor may be of either n or p-conductivity type and, as described hereinafter, the conductivity path is taken as of n-type. When using an n-type current conductivity path, p-type regions may be located on either side of the conductivity path to form the gate and modulate the current flowing in the path. To complete the arrangement, ohmic contacts may be provided at either end of the path, the contact at which the carriers flow into the semiconductor path being called the source and the contact at which they flow out called the drain. In transistor terminology, the source, the drain and gate correspond to the cathode, plate and grid of a vacuum tube respectively.

Basically, when such a field-effect transistor is connected into a circuit where the gate is at zero voltage and the drain is made slightly positive relative to the source, current flows in the conventional sense from the drain to the source. This current consists of electrons flowing through the n type channel from the source to the drain. As a result of the currents flowing through the semiconductor channel, an IR drop occurs along the channel, and this produces a potential difference between the p-type gate material and the n-type channel material. This potential difference is greater for those portions of the gate farthest from the source, thus resulting in a wedge, or funnel-shaped, space-charge barrier, limiting the current flow in the semiconductor channel. Any increase in current through the channel increases the IR drop, and hence tends to increase the space charge and close off the current flow. When the drain voltage reaches a critical limiting value, the current channel is completely closed or pinched off at its drain end due to the space-charge barrier. Virtually no further increase in drain current will result when the drain voltage is raised above the critical limiting value, the only effect of this voltage being to change the channel shape at constant current. As the gate is biased negatively with respect to the source, the magnitude of the IR drop necessary to close off the current channel to further increases in current with increases in the drain voltage will be smaller since part of this voltage is already supplied by the bias. Accordingly, saturation occurs at a lower value of drain voltage and current.

The curves of the drain current produced by increasing values of drain voltage at different gate potentials are shown in FIGURE 1. It should be noted that those curves are very similar to the static output characteristics of a pentode vacuum tube. The top curve for a gate potential of zero shows that the drain current $I_D$ increases as the drain voltage $V_D$ increases until the critical limiting voltage designated as $W_0$ is reached. At the critical limiting voltage of $W_0$, the curve attains a slope which rises only slightly above zero as shown and decreases with further increase in drain voltage. The inverse of this slope, that is, the change in voltage divided by the change in current produced by the change in voltage gives the internal resistance of the unit when operated at a drain voltage greater than the critical limiting voltage of $W_0$. The other two curves shown with gate potentials equal to $-W_0/4$ and $-W_0/2$ illustrate that a smaller magnitude of IR drop is required to reduce the channel to zero and pinch off the conducting channel since part of this voltage is supplied by the gate bias potential.

Since the final slopes of the curves of FIGURE 1 may be very small, the drain resistance $r_d$ for the field-effect transistor or the plate resistance $r_p$ for a vacuum tube is correspondingly very large and represents the internal resistance of each respective device. For example, silicon and germanium field-effect transistors have been constructed with an internal resistance $r_d$ within the range of $10^5$ to $10^7$ ohms. In order to obtain maximum power sensitivity (the ratio of output power to input power) from such a device, the load resistance must be equal to internal resistance. Further, if these devices are to provide voltage amplification, it is necessary to introduce a load resistance into the drain current or plate current path and thus cause a voltage drop across the resistance by the output current from the device. When the load resistance is equal to the internal resistance of the devices for the condition of maximum power sensitivity, a condition is provided for a high voltage gain equal to $u/2$ where $u$ is equal to $g_m r_d$ and $g_m$ is the mutual conductance of the unit. A gain of $u/2$ follows from the fact that the load resistance is in series with the internal resistance of the device and since the two are equal, the voltage divides between the two resistances. When such a device is to function primarily as a voltage amplifier, the load resistance should be very high and equal to or greater than the internal resistance of the device if maximum gain is to be provided.

However, the operation of such devices with the load resistance equal to or greater than the internal resistance, the condition for maximum power sensitivity and high gain, presents a serious problem because of the magnitude of the voltage drop in the load resistor. For example, if the internal resistance $r_d$ is $10^5$ ohms, the load resistor is equal in resistance to the internal resistance, and the output current from the unit is 5 milliamps, the voltage drop across the load resistor is 500 volts. Therefore, the total supply voltage to the unit must be in excess of 500 volts, an uneconomically high voltage, to overcome the voltage drop in the load resistor and apply a bias voltage to the drain or palte of the device. This difficulty can be minimized, however, if the load resistor is a constant current device which has a high differential resistance to alternating current but a low static resistance to direct current. With such a constant-current device, the gain or power sensitivity of the unit would then be determined by the high differential resistance and the voltage drop in the load by the low static resistance.

It is accordingly a primary purpose of this invention to disclose a semiconductor constant-current device of low static resistance to direct current but a very high dynamic resistance to alternating current which permits a low voltage power supply to be used and provides for high gain and high power sensitivity at a high efficiency.

It is another object of this invention to provide a self-contained semiconductor constant-current device which is very small, compact and rugged, and constructed with but two terminals for simplicity in circuits utilizing constant-current devices.

It is another object of this invention to provide a semiconductor constant-current device which is not subject to the frequency limitations of inductors when used as loads.

As another primary object, this invention discloses a semiconductor constant-current device integrally attached to a field-effect transistor thereby providing high input impedance, high power sensitivity and high voltage gain in a single and very small, compact device.

It is a still further object of this invention to provide a semiconductor constant-current device suitable for use as a load resistance in the output circuit of vacuum tubes and for use in other circuits such as constant-current D.-C. filters and constant voltage D.-C. filters.

The above enumerated objects will be clarified and other objects made known from the following discussion when taken in conjunction with the drawings in which.

Figures 2, 2A, 3:
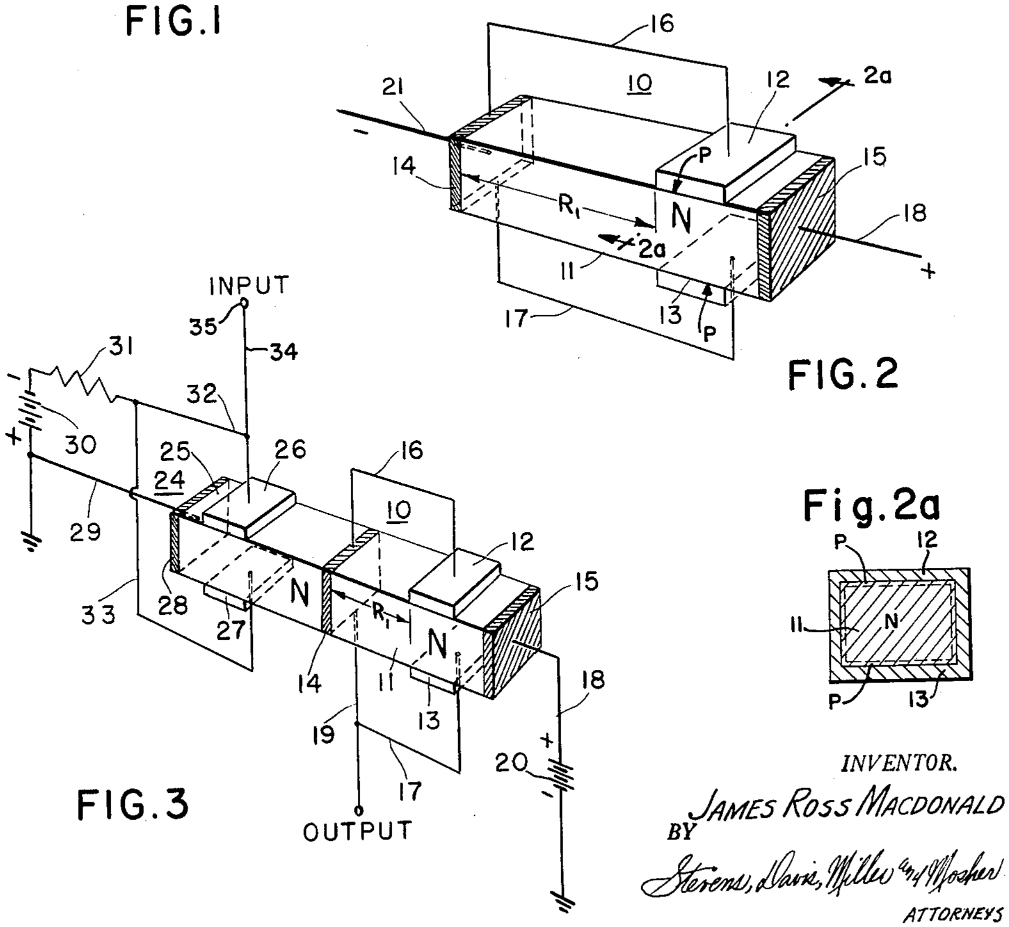
FIGURE 2 illustrates the constant-current device of the present invention.
Figure 4:
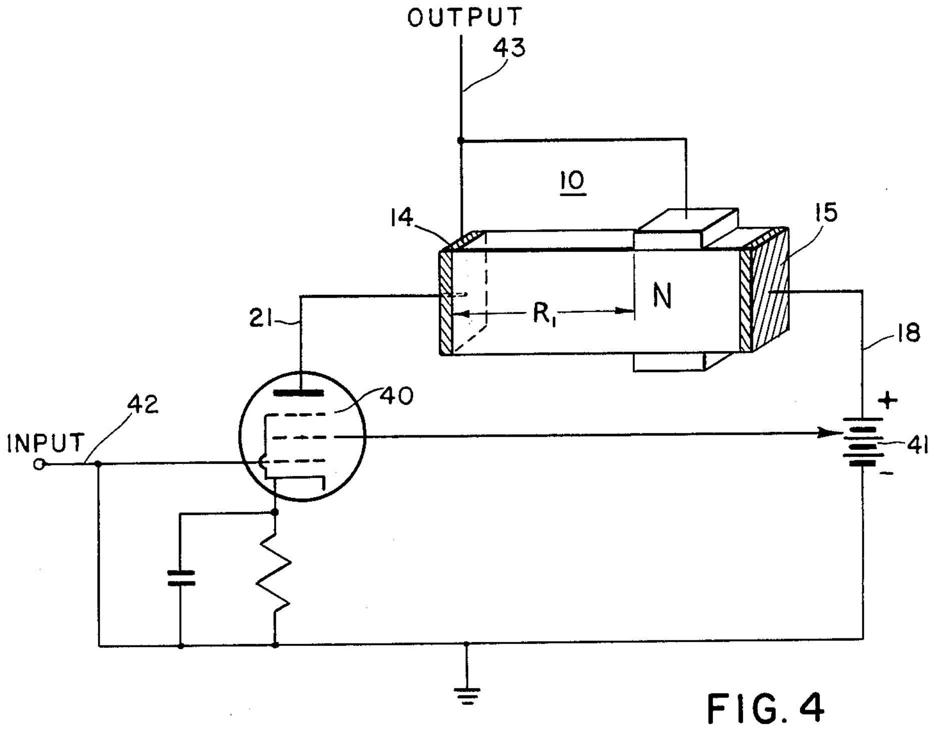
Figure 5:
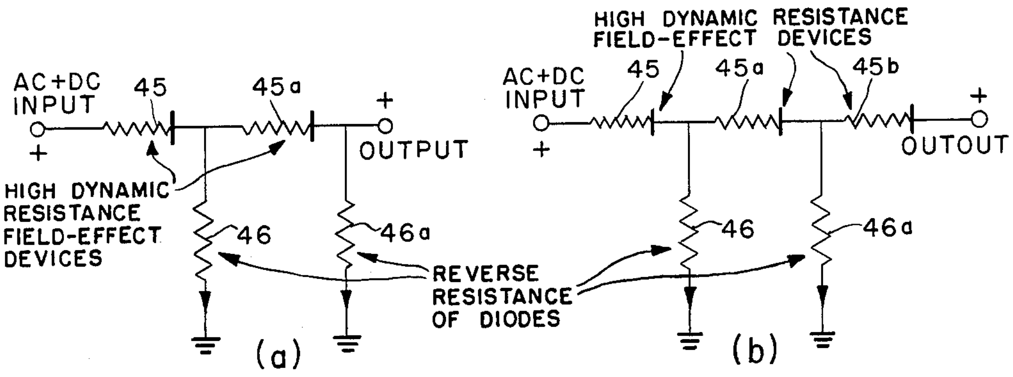

FIGURE 2*a* is a cross-sectional view of the semiconductor device of FIGURE 2 taken along the line 2—2 and including an alternative embodiment of the gate structure;

FIGURE 3 represents the constant-current device of this invention integrally attached to a field-effect transistor and connected into a circuit for operation at high power sensitivity and voltage gain;

FIGURE 4 shows the constant-current device of the present invention used as the plate load resistance of a pentode tube; and FIGURES 5(*a*) and 5(*b*) represent schematically filter circuits composed of constant-current devices and constant voltage devices to provide a constant D.-C. voltage output and a constant D.-C. current output respectively.

Referring now to FIGURE 2, the semiconductor constant-current device of the present invention is designated generally by the numeral 10. The current conducting path 11 of the constant-current device 10 is of the n-type conductivity and is longer than the current conducting path of the ordinary field-effect transistor by a distance equal to the ohmic resistance $R_1$. As one embodiment, the current conducting path 11 has been constructed with a length of .250 inch and a cross section of .250 inch in height and .005 to .010 inch in width. An ohmic contact 14 is attached to the $R_1$ resistance section of path 11 while another ohmic contact 15 is attached at the other end of the current conducting path. For clarity, FIGURE 2 shows two p-type gates 12 and 13 located on either side of the current conducting path 11 in the field-effect transistor region and connected with ohmic contact 14 by means of leads 16 and 17, respectively. In actual practice, as illustrated in FIGURE 2*a*, the gate consists of a single region encircling the conductivity path to insure that none of the current flows along the surface of the conducting channel. In the embodiment referred to above, the gate consists of a p-type region, approximately .125 inch in width, fused into the n-type material which completely encircles the path except for space of .0002 to .002 inch along one of the narrow sides. The position of the gate along the path determines the length of the ohmic resistance $R_1$ and with this construction, only a single lead is used to apply the voltage drop across the $R_1$ section to the gate. The dimensions given provide a constant-current device with certain electrical characteristics which, of course, may be changed in accordance with the electrical characteristic desired.

The constant-current device is provided with two terminals 18 and 21 for connecting the device into a circuit. Lead 18 is connected to ohmic contact 15 and used either to apply a positive voltage to the drain or plate of an amplifier and bias the constant-current device for current flow from source to drain or for connection to another constant-current or voltage device. The other lead 21 is connected with ohmic contact 14 and serves either as the alternating current input lead to the constant-current device or as a connecting terminal to another constant-current or voltage device.

Figure 1:
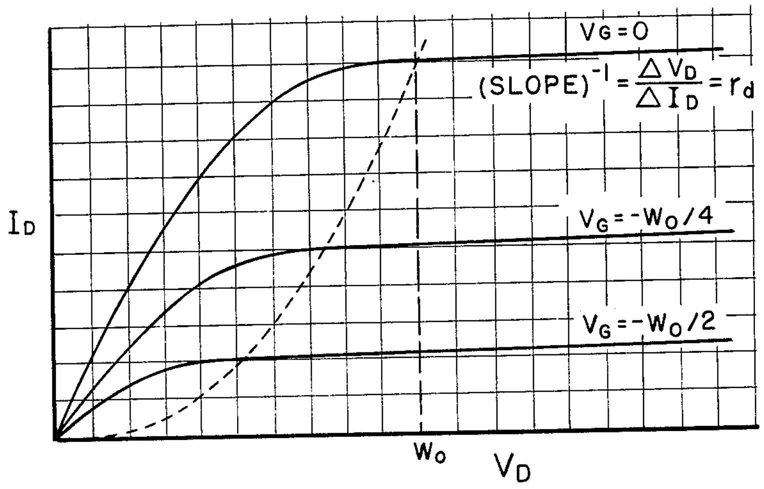
FIGURE 1 (described above) represents a family of curves for the drain current of a field-effect transistor plotted against drain voltage at different gate potentials.

With a positive bias voltage above the critical limiting voltage $W_0$ across the constant-current device applied by lead 18, it can be seen from FIGURE 1 that the device operates in the constant slope range of the curves and is thus biased to provide a substantially constant-current due to the very small slope of the curves. The quiescent current flowing through the device causes a static D.-C. voltage drop across the ohmic resistance $R_1$ and this static voltage drop is applied to the field-effect transistor region by leads 16 and 17. As an alternating voltage is applied, the voltage drop is determined by the high dynamic resistance of the field-effect transistor region and the ohmic resistor $R_1$ with the shape of the current conducting channel controlled by the self-bias voltage from the ohmic resistance $R_1$. It should be noted that the peak A.-C. output voltage under these circumstances must not exceed an amount which will prevent the load resistor from functioning as a constant-current device over the entire range of excursion of the dynamic operating point. Thus, a semiconductor constant-current device having only two terminals and requiring no external bias supply is afforded by an ordinary field-effect transistor provided with self-bias voltage developed across an ohmic semiconductor resistance $R_1$ forming an integral part of the device.

Since the critical limiting voltage $W_0$ of FIGURE 1 and the mutual conductance of the field-effect transistor are both independently disposable, the D.-C. voltage across and the D.-C. current through the unit and the dynamic resistance can all be controlled within limits. In actual practice, field-effect transistors operated as constant-current devices with self bias have provided a ratio of dynamic resistance to static resistance in the neighborhood of 20 to 1; however, it is reasonable to expect that much higher ratios of dynamic to static resistance can be obtained, possibly as high as 1000 to 1. This ratio of dynamic to static resistance plays the role of Q for an inductance or a capacitance since it is the ratio of A.-C. impedance to D.-C. impedance, but it should be noted that this ratio is not subject to the frequency limitations of inductance and capacitance.

In FIGURE 3, a high impedance, high power sensitivity, and high voltage gain device is shown wherein a constant-current device as described above forms an integral part of an ordinary field-effect transistor 24 and serves as its load resistance. The field-effect transistor 24 is comprised of a conducting part 25 of n-type conductivity with current modulation control supplied by p-type gates 26 and 27 located on either side of the conducting path. The constant-current device, numbered as in FIGURE 2, is attached to the field-effect transistor by means of ohmic contact 14 which consists of a high donor $n+$ section common to both the transistor and the constant-current device. Actually, this high donor section is grown as part of the composite unit by increasing the donor impurity concentration in a crystal puller melt for the time required to produce a section of the desired width. At the other end of the transistor, ohmic contact 28 is attached to the source connected to ground through lead 29. A positive voltage is applied to ohmic contact 15 by battery 20 connected with lead 18 to ground to thereby cause an electron flow through the composite semiconductor device from source to drain. Gates 26 and 27 are biased negatively with respect to the source by the voltage from battery 30 through resistor 31 and delivered by leads 32 and 33 respectively. Lead 34 applies input signals to gates 26 and 27 of the field-effect transistor and the amplified signals are taken from lead 19 at the drain of the transistor.

In operation, the current flow through field-effect transister 24 established by the positive drain voltage is modulated by input signals to the gates 26 and 27. With the operating point of the constant-current device 10 maintained above the critical limiting voltage as determined by battery 20, the constant-current device exhibits the high dynamic resistance to alternating current flow and low static resistance to direct current flow as described above. The voltage drop due to the current flowing through the high dynamic resistance of the constant-current device as the load resistor results in highly amplified signals at the output lead 19 of the combined unit. Thus far, voltage gains have been obtained from such an amplifying unit which are approximately 20 times greater than the maximum obtainable with an ordinary resistance load and the same drain battery supply. However, values of $R_{in}$ equal to $10^8$ ohms, $r_d$ equal to $10^6$ and $g_m$ equal to $2\times10^{-3}$ mhos should be possible in such units. The term $R_{in}$ is used to designate the differential or signal input resistance of the amplifier device appearing between ground and the signal input terminal 35 of the field-effect transistor of FIGURE 3. The term $g_m$ is used to designate the mutual conductance of the unit. Thus, with these parameters and a dynamic load resistance equal to $r_d$, voltage gains of $10^3$ and power gains of $10^8$ or 80 db are possible from a single, four terminal, semiconductor device as described above.

As a further illustration of the manner in which a constant-current device of high dynamic resistance and low static resistance can be used, the device of the present invention is shown in FIGURE 4 as the plate load resistance of a pentode vacuum tube. In this illustration, the two-terminal semiconductor constant-current device 10 is connected between battery 41 and the plate of pentode tube 40. The positive terminal of battery 41 is connected through lead 18 to ohmic contact 15 while the negative terminal of the battery is connected to the cathode of the tube through a resistor. The positive voltage applied to the plate of tube 40 is equal to the voltage of battery 41 minus the static D.-C. voltage drop through the resistance $R_1$ and a voltage drop greater than the critical limiting voltage across the constant current device. As input signals are applied by lead 42 to the grid of tube 40, the plate current fluctuates in accordance with the signal and this alternating current is fed by lead 21 to the constant-current device 10. The alternating current through the high dynamic resistance of the device causes a large IR drop and consequently, a high voltage gain at the output lead 43. Also, in a circuit substantially similar to FIGURE 4, it is apparent that pentode tube 40 could be replaced by a vacuum tube triode or for that matter, another field-effect transistor to accomplish the same result although the use of a field-effect transistor would lose the advantage of the single combined unit described in FIGURE 3.

As a further illustration of circuits in which constant-current devices can be used, circuits for frequency independent filtering of alternating currents from direct current are shown in FIGURES 5(*a*) and 5(*b*). The constant-current device with a low static resistance and high dynamic resistance is represented schematically in the circuits of FIGURES 5(*a*) and 5(*b*) by the components identified by the numeral 45. The components of these circuits represented schematically and designated by numeral 46 are silicon diodes operated in the reverse bias Zener breakdown region. Such a diode is the dual of the constant-current device in that it has very low dynamic resistance and relatively high adjustable static resistance; thus, it is, by definition, a constant voltage device. If a mixed A.-C. and D.-C. voltage is applied to the input of FIGURE 5(*a*), the constant voltage device 46 in series with constant-current device 45 to ground acts as a voltage divided in which a large fraction of the D.-C. voltage is developed across the constant voltage device due to its high static resistance while very little A.-C. voltage is developed across device 46 because of its low dynamic resistance in relation to the high dynamic resistance of the constant-current device 45. The high D.-C. voltage and small A.-C. voltage from device 46 is fed to a second voltage divider circuit consisting of constant-current device **45*a* and constant voltage device 46*a* which serves to further filter the A.-C. voltage and, because 46*a*** is a constant voltage device, the output of the filter results in a constant voltage output. The circuit of FIGURE 5(*b*) is identical to that of FIGURE 5(*a*) except for the additional constant-current device **45*b*. Since the output from 46*a* is composed of a small A.-C. voltage and a high D.-C. voltage, the A.-C. voltage is further reduced by the high dynamic resistance of 45*b*** while the high voltage meets with a low static resistance with the result that a constant direct current appears at the output of the circuit.

While the use of a constant-current device has been described in connection wtih several illustrative applications, it is apparent that the illustrations given are by no means exclusive. Accordingly, it is the object of this invention to claim a semiconductor constant-current device with a high dynamic resistance and a low static resistance and further, the use of such a constant-current device in circuits where such characteristics are desirable.

What is claimed is:

1. An integrated semiconductor device comprising:
(a) a body of single crystal semiconductor material,
(b) a first region of said body of one conductivity type,
(c) a second region of the body of said one conductivity type,
(d) a first gate in said body including at least one region of opposite conductivity type defined adjacent an intermediate part of said first region, the first gate dividing the first region into first and second parts which are connected together within the body only by a narrow first channel portion underlying said first gate, the first gate being contiguous to said first channel portion but separated therefrom by first P-N junction means,
(e) a second gate in said body including at least one region of said opposite conductivity type defined adjacent an intermediate part of said second region, the second gate dividing the second region into first and second parts which are connected together within the body only by a narrow second channel portion underlying said second gate, the second gate being contiguous to said second channel portion but separated therefrom by second P–N junction means,
(f) conductive means making ohmic connection in common to the first part of the second region and the second part of the first region,
(g) means including ohmic contacts for applying operating bias between the first part of the first region and the second part of the second region,
(h) means for applying input signals to the first gate,
(i) and means for connecting the second gate to a point on said second region so that at least part of the P–N junction between the second gate and the second channel will be reverse biased.

2. An integrated semiconductor device comprising:
(a) an elongated body of single crystal semiconductor material, (b) a first region adjacent one end of said body of one conductivity type,
(c) a second region adjacent the other end of the body of said one conductivity type,
(d) the first and second regions being integrally joined within the body,
(e) a first gate in said body including at least one region of the opposite conductivity type defined adjacent an intermediate part of the first region, the first gate dividing the first region into a source and a drain which are connected together within the body only by a narrow first channel portion underlying said first gate, the first gate being contiguous to the first channel portion but separated therefrom by first P–N junction means,
(f) a second gate in said body including at least one region of the opposite conductivity type defined adjacent an intermediate part of the second region, the second gate dividing the second region into source and drain regions which are connected together within the body only by a narrow second channel portion underlying the second gate, the second gate being contiguous to the second channel portion but separated therefrom by second P–N junction means,
(g) means including ohmic contacts connected to the source of the first region and the drain of the second region for supplying operating bias to the device,
(h) the drain of the first region being integrally connected to the source of the second region at an intermediate portion of the elongated body,
(i) means for supplying input potentials to the first gate so that the first region acts as an amplifier of such signals,
(j) and means for electrically connecting the second gate to a fixed point on said second region so that the second region functions as a constant-current load for the amplifier of the first region.

3. An integrated semiconductor device comprising:
(a) a body of single crystal semiconductor material,
(b) a first field-effect transistor defined in the body and including a channel and a gate,
(c) a second field-effect transistor defined in the body and including a channel and a gate,
(d) conductive means making ohmic connection in common to one end of the channel of the first field-effect transistor and to one end of the channel of the other field-effect transistor, said conductive means providing an output terminal,
(e) means for supplying operating bias across the other ends of the channels of the first and second field-effect transistors,
(f) means for applying signal potentials to the gate of the first field-effect transistor,
(g) and means for connecting the gate of the second field-effect transistor to an end of the channel thereof so that the second field-effect transistor provides a load impedance for the first field-effect transistor.

4. An integrated semiconductor device comprising:
(a) a body of single crystal semiconductor material,
(b) a first field-effect transistor including a channel defined in the body and including a gate overlying said channel,
(c) a second field-effect transistor including a channel defined in the body and including a gate overlying said channel,
(d) conductive means making ohmic connection in common to one end of the channel of the first field-effect transistor and to one end of the channel of the other field-effect transistor, said conductive means providing an output terminal,
(e) means for supplying operating bias across the other ends of the channels of the first and second field-effect transistors,
(f) means for applying signal potentials to the gate of the first field-effect transistor,
(g) and means for connecting the gate of the second field-effect transistor to an end of the channel thereof so that the second field-effect transistor provides a load impedance for the first field-effect transistor.

References Cited by the Examiner

UNITED STATES PATENTS 2,778,956 1/57 Dacey et al. ---------- 330—38 X

OTHER REFERENCES

Dacey et al.: Article, Unipolar "Field-Effect" Transistor, Proc. of the IRE, pages 970–979, August 1953, vol. 41, issue 8.

ROY LAKE, *Primary Examiner.*

NATHAN KAUFMAN, *Examiner.*